(12) United States Patent
Saxena et al.

(10) Patent No.: US 7,047,505 B2
(45) Date of Patent: May 16, 2006

(54) METHOD FOR OPTIMIZING THE CHARACTERISTICS OF INTEGRATED CIRCUITS COMPONENTS FROM CIRCUIT SPECIFICATIONS

(75) Inventors: Sharad Saxena, Richardson, TX (US); Andrei Shibkov, San Jose, CA (US); Patrick D. McNamara, San Jose, CA (US); Carlo Guardiani, Verona (IT)

(73) Assignee: PDF Solutions, Inc., San Jose, CA (US)

( * ) Notice: Subject to any disclaimer, the term of this patent is extended or adjusted under 35 U.S.C. 154(b) by 211 days.

(21) Appl. No.: 10/399,124

(22) PCT Filed: Oct. 16, 2001

(86) PCT No.: PCT/US01/32424

§ 371 (c)(1),
(2), (4) Date: Oct. 14, 2003

(87) PCT Pub. No.: WO02/33544

PCT Pub. Date: Apr. 25, 2002

(65) Prior Publication Data

US 2004/0064296 A1    Apr. 1, 2004

Related U.S. Application Data

(60) Provisional application No. 60/240,882, filed on Oct. 17, 2000.

(51) Int. Cl.
*G06F 17/50* (2006.01)

(52) U.S. Cl. ............................... 716/2; 703/14; 703/15; 703/16

(58) Field of Classification Search .................... 716/2; 703/14–16
See application file for complete search history.

(56) References Cited

U.S. PATENT DOCUMENTS

| | | | |
|---|---|---|---|
| 5,572,436 A | 11/1996 | Dangelo et al. | 364/489 |
| 5,646,870 A * | 7/1997 | Krivokapic et al. | 716/4 |
| 5,867,405 A * | 2/1999 | Jiang et al. | 703/5 |
| 5,870,308 A | 2/1999 | Dangelo et al. | 364/489 |
| 6,219,630 B1 * | 4/2001 | Yonezawa et al. | 703/14 |
| 2002/0073388 A1 * | 6/2002 | Orshansky et al. | 716/5 |

OTHER PUBLICATIONS

Saxena et al., "Circuit-Device Co-design for High Performance Mixed-Signal Technologies", 2000 IEEE, pp. 143-146.

(Continued)

*Primary Examiner*—Vuthe Siek
*Assistant Examiner*—Naum Levin
(74) *Attorney, Agent, or Firm*—Duane Morris LLP; Steven E. Koffs

(57) ABSTRACT

A method for selecting a process for forming a device, includes generating a plurality of equations using a response surface methodology model. Each equation relates a respective device simulator input parameter to a respective combination of processing parameters that can be used to form the device or a respective combination of device characteristics. A model of a figure-of-merit circuit is formed that is representative of an integrated circuit into which the device is to be incorporated. One of the combinations of processing parameters or combinations of device characteristics is identified that results in a device satisfying a set of performance specifications for the figure-of-merit circuit, using the plurality of equations and the device simulator.

16 Claims, 1 Drawing Sheet

OTHER PUBLICATIONS

Barry, Michael, "Estimating the Effects of Process Technology Improvements on Microprocessor Performance", 1994 IEEE, pp. 276-279.

Saxena et al. "An Asymptotically Constant, linearly Bounded Methodology for the Statistical Simulation of Analog Circuits Including Component Mismatch Effects", 200, pp. 15-18.

Winslow and Trew, "Simulated Performance Optimization of GaAs MESFET Amplifiers", 1991 IEEE, pp. 393-402.

Stoneking et al., "Simulation of the Variation and Sensitivity of GaAs MESFET Large-Signal Figures-of-Merit due to Process, Material, Parasitic, and Bias Parameters", 1989 IEEE, pp. 228-236.

* cited by examiner

METHOD FOR OPTIMIZING THE CHARACTERISTICS OF INTEGRATED CIRCUITS COMPONENTS FROM CIRCUIT SPECIFICATIONS

This application claims the benefit of U.S. Provisional Application No. 60/240,882, filed Oct. 17, 2000.

FIELD OF THE INVENTION

The present invention pertains to the optimization of the performance and manufacturability of integrated circuits.

BACKGROUND OF THE INVENTION

The vertiginous growth of the micro-electronics market has created a set of spectacular problems both from technical and from the business point of view. The investment required to set up a Very Large Scale of Integration (VLSI) fabrication plant for Deep Sub-Micron (DSM) technologies is in excess of 1 Billion U.S. dollars, and the time to capitalize on that investment is constantly shortening; the speed and power performance capabilities of consumer products and technologies, such as telecommunications, networking, entertainment, and the like become obsolete rapidly and need to be constantly improved.

Therefore, it is desirable for any IC foundry to be able to serve mutliple end-user applications with the same fabrication technology, in order to achieve consistent economy of scale saving.

The problem of modeling and optimizing the electrical properties of integrated devices has been recently explored in the work of M. Miyama and S. Kamohara *"Circuit Performance Oriented Device Optimization using BSIM3 Pre-Silicon Model Parameters"*, IEEE-ACM Asia-Pacific DAC, Yokohama, JP, January 2000, where the predictive capabilites of standard Bsim3v3 SPICE model have been applied towards modeling and optimization of the critical path of a CPU. SPICE (Simulation Program with Integrated Circuit Emphasis) is a family of programs (freeware or commercial) for simulation of electronic circuits, based on a kernel developed by Berkeley University (California, USA) since 1960 with public founds. Today's commercial packages are based on SPICE3f5, and they add to it many functions and features.

In these methods, the target circuits are directly simulated using the SPICE program while manually changing the value of the Bsim3v3 model parameters until the desired specifications are met. This procedure is highly inefficient.

In another recent publication (Y. Cao, T. Sato, M. Orshansky, D. Sylvester and C. Hu, *"New Paradigm of Predictive MOSFET and Interconnect Modeling for Early Circuit Simulation"*, IEEE 2000 *Custom Integrated Circuits Conference*, Orlando (Fla.), May 2000) the problem of generating predictive SPICE model parameters is also addressed by using the Bsim3v3 standard MOSFET model.

However, different product applications pose different, sometimes conflicting, requirements on the underlying technology components, and the specification of a complete set of device characteristics (such as, for example, MOSFETs threshold voltage and drive current ($I_{DS}$), trans-conductance ($g_m$), output conductance ($g_{ds}$) and the like, which best fit that large set of multiple, conflicting requirements) is an overwhelming task using the methods and systems of the prior art.

SUMMARY OF THE INVENTION

One aspect of the invention is a method for selecting a process for forming a device, comprises generating a plurality of equations using a response surface methodology model. Each equation relates a respective device simulator input parameter to a respective combination of processing parameters that can be used to form the device. A model of a figure-of-merit circuit is formed that is representative of an integrated circuit into which the device is to be incorporated. One of the combinations of processing parameters is identified that results in a device satisfying a set of performance specifications for the figure-of-merit circuit, using the plurality of equations and the device simulator.

Another aspect of the invention is a method for designing a device, comprising generating a plurality of equations using a response surface methodology model. Each equation relates a respective device simulator input parameter to a respective combination of device characteristics. A model of a figure-of-merit circuit is formed that is representative of an integrated circuit into which the device is to be incorporated; and identifying one of the combinations of device characteristics that causes the device to satisfy a set of performance specifications for the figure-of-merit circuit, using the plurality of equations and the device simulator.

OVERVIEW

Figure 1:
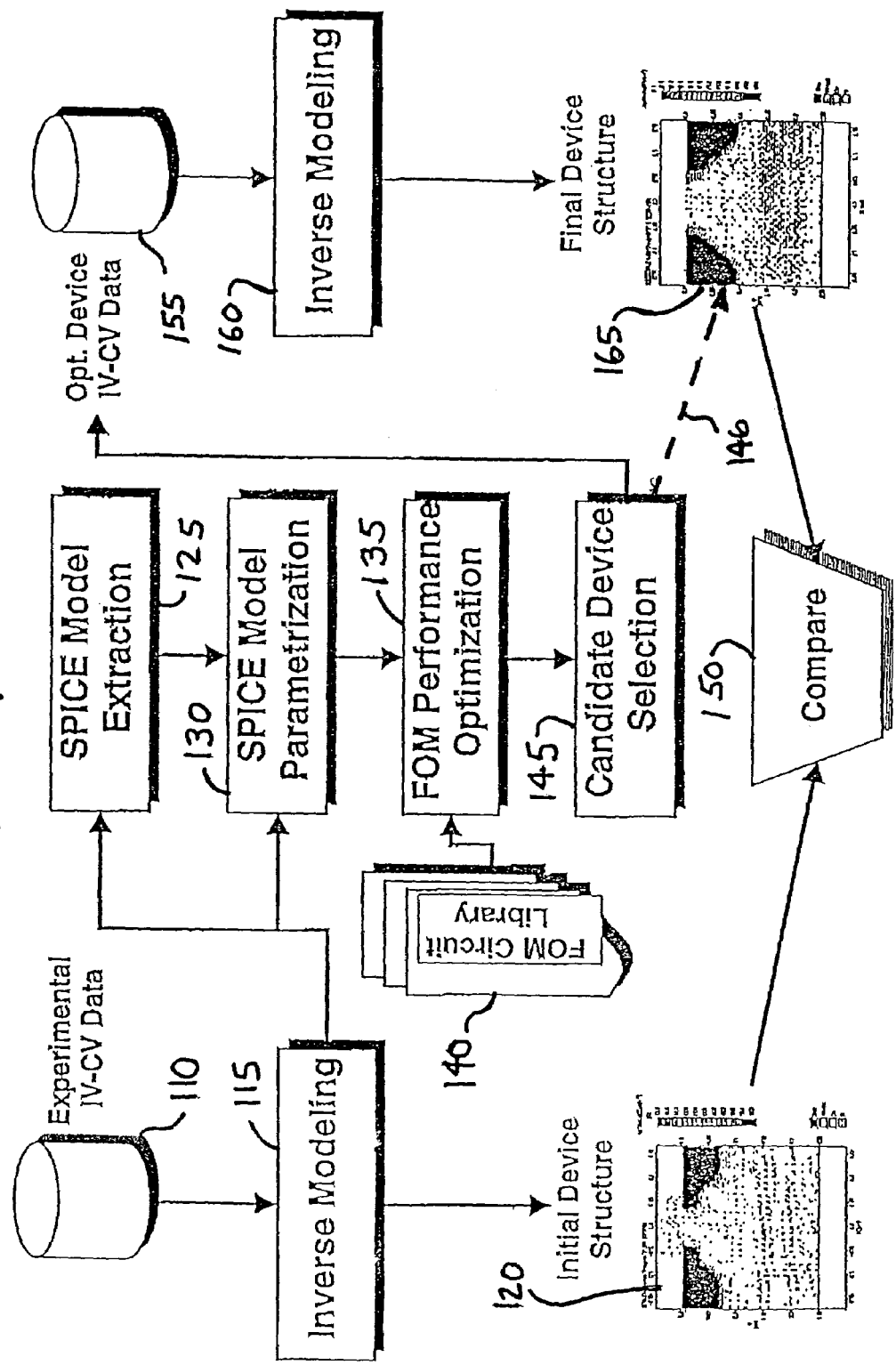
FIG. 1 is a flow diagram showing an exemplary method according to the present invention.

The exemplary embodiment of the invention is an efficient method for optimizing the characteristics of devices, such as MOSFETs and BJT transistors, Capacitors, Resistors and the like, for the types of Integrated Circuits (ICs) in which they are incorporated. In the exemplary method, a set of Figure Of Merit (FOM) circuits are designed in order to extract the sensitivity of circuit performance parameters to the characteristics of the constituent devices that are to be optimized. A set of performance objectives and constraints are defined for the FOM circuit performance parameters, and the device characteristics are optimized in order to maximize the performance objectives while meeting all the constraints. In this way, it is possible to quickly and effectively tune the devices of any given IC fabrication technology according to application specific requirements, such as high speed, low-power, or analog.

The exemplary system explicitly models the target circuit performance (CPU critical path delay) as a function of physical process parameters. This allows optimization of the device based on the circuit specification of a circuit that includes the device. Preferably, the method uses data characterizing the device derived from two different sources: (1) empirically measured current v. voltage (IV) and capacitance v. voltage (CV) data taken from actual circuits, and (2) expanded (parameterized) SPICE models derived by inverse modeling based on the IV-CV data. These two data flows are combined at the level of the parameterized SPICE models.

The exemplary method shown in FIG. 1 includes the following four steps:

1. Steps 125 and 130 form parametrized compact device models, in which the variables of the models are functions of the physical device characteristics. This is accomplished by running a Design Of Experiments (DOE) on a set of device variables, such as energy and dose for channel implants, source/drain implants, and the like, extracting the value of the parameters of the compact device model for all points of the DOE at step 125 and fitting a low order polynomial model to the values by inverse modeling at step 115.

2. At step 140 a set of Figure Of Merit circuits is selected.

3. At step 135, the performance parameters of the FOM circuits are evaluated for all the points of the DOE defined in step 1 and a Response Surface Methodology (RSM) Model is constructed.

4. At step 160, the RSM macro-models are optimized according to a set of performance objectives and specifications. The AC/DC device characteristics 155 corresponding to the optimum device are extracted and used to derive a set of specifications for the design of the device at step 165.

DETAILED DESCRIPTION

The exemplary approach constructs a direct mapping between the integrated circuit device space and the integrated circuit performance space to analyze and quantify the impact of device design on circuit design. The relationship between devices and the end-of-line circuit is typically broken into two direct mappings; the first being a compact modeling of the device by fitting simulated and/or measured characteristics and the second by the fitted compact model parameters to the circuit via simulation tools such as SPICE style integrated circuit simulators. Circuit response by this typical formulation can only be related to the device compact model and relies heavily on the accuracy of the physics employed by such a model to infer the responses relation to the original device structure and its characteristics. The method described herein allows a direct relation between the component structure and its associated characteristics and the circuit response. A mapping as described allows optimization of an integrated circuit device by quantifying the tradeoffs in circuit response as a result of exploring the component design space.

Compact Device Model Selection

One aspect of this method is the independence of the compact model chosen to fit the simulated or measured device characteristics. Because compact models typically rely on both a physical and empirical set of parameters to allow robust application over a wide range of semiconductor technologies, their direct representation of the actual device becomes corrupted at the expense of a better characteristic fit. The method of parameterizing the model in terms of the actual device structure is advantageous in that it decomposes this mostly non-physical representation into a representation which can be physically related to the device under design. Such a decomposition does not rely upon the original quality of the device compact model.

Initial Device Compact Model Extraction

The initial device compact model representation is carried out in a fashion typical for device characteristic extraction. The nominal or typical device is simulated or measured, providing its characteristics (e.g. IV-CV data) 110. At step 115, inverse modeling builds a device structure having characteristics that ideally exactly reproduce the data 110. However, the characteristics are likely to differ slightly due to errors introduced by inverse modeling 115. Therefore, as part of step 115, a design of experiment (DOE) is run to generate many sets of "simulated" IV-CV data, from which each set is used to extract an individual SPICE model 125. The inverse modeling creates an initial (inverse modeled) device structure 120. Ideally, the initial device characteristics 110 are centered around the device parameter space such that exploring the space in one or multiple dimensions would require the least perturbation in the original model fitting. This insures the most accurate mapping over the device space. This initial structure 120 has a DOE performed on it which creates the data for SPICE model extraction 125. SPICE model extraction 125 then creates the data for building of the RSM model. At step 125, the data are fit to the parameter set contained within the compact model of choice.

Device Model Parameterization

Parameterization of the device compact model entails performing a design of experiments over the device space. Each resulting experimental device has associated with it a corresponding set of device characteristics which may be extracted and fit to the same compact model used in the initial compact model extraction. At least two methods exist which may be utilized to perform this function. They are described as follows;

Inverse Modeling (step 115)

The physical device parameters (e.g. channel implant energy/dose, oxide thickness, LDD spacer, and the like) are perturbed per the defined design of experiments. Each resulting set of characteristics is fit to the chosen device compact model.

Silicon Based Modeling

A design of experiments is applied as a set of split lot conditions which are defined to effectively perturb the equivalent device structural parameters as explained above. Each device is then measured in silicon to extract the corresponding device characteristics resulting in the extraction of representative device compact model for each split lot condition.

Response Surface Methodology (RSM) modeling is performed within step 130. The SPICE model parameterization is representing the SPICE model parameters by an RSM model instead of a constant parameter value.

Compact Model Expansion

At step 130, the design of experiments explained above results in a set of device compact model parameters for each device characteristic extraction. From the correlation information obtained by relating the device compact model parameter sets to their corresponding device structure perturbations, a first order decomposition of the underlying device compact model equations may be performed such that the compact model parameters are equated to a linear function of the device structural parameters. This effectively maps the device structural parameters to the compact model and retains the underlying physics inherent to the device characteristics. Instead of merely specifying measured parameters, equations are used to define how the SPICE model parameters vary as a function of the process parameters used in forming the devices. These expanded models are referred to as "parameterized SPICE models", wherein a respective equation is provided to specify each respective SPICE input parameter, as a function of input processes.

These equations are the RSM models provided within the inverse modeling block 115. Now, the SPICE parameters can be a function of processing condition parameters, or device architecture parameters. The parameters are decided upon based upon what is available to drive the DOE in step 115. It is mainly a function of the tool used. In the exemplary method, device architecture parameters are used.

Figure of Merit Circuit Selection

At step 140, the Figure of Merit circuit selection is performed. The circuits in the FOM library are preferably simple, canonical circuits that capture the capability of a technology for a particular class of applications. The simplest example of a FOM circuit suitable for high-speed digital applications is a ring-oscillator. The propagation delay ($T_{pd}$) of a ring-oscillator is representative of high speed digital circuits. An example for capturing analog characteristics is a basic operational transconductance amplifier (OTA) circuit. An OTA exploits the effects of device characteristics in the strong inversion regions of operation (e.g. gds, gm) as opposed to those represented by typical digital blocks. The robustness of this method allows a wide range of applications such as Analog/Mixed-Signal and DRAM to be characterized in the same device structural space. Hence, tradeoffs towards one application or another may be quantified.

Device to Circuit Mapping

At step 135, the actual output response of the circuit based upon the device parameters may now be performed using the Figure of Merit circuits in conjunction with the expanded device compact model (parameterized SPICE model). Typical circuit simulation is carried out on the Figure of Merit circuits to which the circuit response space is explored via a Design of Experiments on the input device parameters. This effectively maps the device space directly to the circuit response space. The mapping is captured by the most accurate and capable model fit allowed by the pre-defined DOE. Typical fits include linear, quadratic, cubic, and the like. Linear fits are not recommended due to the inherent non-linear relationship between integrated circuit devices and their applied circuit responses. The resulting representation of the mapping is incorporated using response surface methods and exists as an analytical model.

RSM Model Optimization

RSM based optimization relies upon the desired circuit responses identified as specifications for as many Figure of Merit circuits and/or standard device characteristics (e.g. Vtsat, Idsat, and the like) as needed. A global optimization is performed to satisfy the multiple constraints given by the circuit specifications. The specifications are driven either by an application specific set of objectives or a general set intending to equalize the application of a particular technology to multiple applications.

Obtaining the Optimal Device

Feeding back the results of optimizing the device in the circuit response space is accomplished by one of two methods. Each method has its advantages. Each is described below;

Device Parameter Back-annotation (step 146)

This step is indicated by the dashed line 146 in FIG. 1. The optimized analytical representation of the circuit responses results in a finalized parameter set. This parameter set defines the inputs to the original device structure from which the space was originally defined. Therefore, the parameters may be directly applied to the device for optimization. The accuracy of back-annotation relies heavily on the quality of fit of the expanded device compact model (parameterized SPICE model).

Inverse Modeling (step 160)

Instead of device parameter back annotation, the optimized analytical representation of the circuit responses directly correlate the circuit performances to the original device parameterization via the expanded device compact models (parameterized SPICE model). In one embodiment, between the two sets of IV-CV data 110 and 155, one set of data is obtained directly from experiments using actual devices, and the other set of data is obtained through simulation. Preferably, IV-CV data 110 are obtained empirically from experiments in silicon, and IV-CV data 155 are provided from simulation. Alternatively, it is contemplated that IV-CV data 110 may be obtained from simulations, and IV-CV data 155 may be obtained empirically from experiments.

The actual output of such an optimization is a parameter set which is evaluated by the expanded device compact model (parameterized SPICE model). Evaluating this model for its representative device characteristics 155 results in data applicable to a direct inverse modeling step 160 which results in a fitted device architecture 165 matching the characteristics 155 generated by the optimization. The accuracy of inverse modeling 160 allows leniency in the accuracy of the expanded device compact model (parameterized SPICE model) in that the final device structure fits the optimized device characteristics 155 (as determined by the capability of the inverse modeling methodology used).

Using device architecture parameters provides an initial device structure 120 and a final device structure 165, where the "final" structure has optimized performance. Then, an additional step (not automated) is performed to determine how to implement the changes in existing semiconductor process to achieve the final optimized structure in manufacturing.

Alternatively, if the DOE in step 115 is performed as a function of processing condition parameters, then following generation of the final device structure 165, this final step (of determining the appropriate changes in fabrication process to implement the final device structure) is automated, and the optimized final structure is fabricated by implementing these process changes.

The exemplary method may be practiced by utilizing the Circuit Surfer statistical design and verification environment (a yield-analysis and improvement solution for analog and mixed-signal IC designers available from Cadence Design Systems, Inc., of San Jose, Calif.) and the Device Designer device analysis and optimization environment. The Circuit Surfer environment supports many tasks typically required for analog and mixed-signal design for manufacturability, such as statistical simulation, sensitivity analysis, response surface modeling, and circuit optimization. Alternatively, another package capable of performing response surface methodology modeling may be used.

The device to circuit mapping is achieved within the framework by performing a DOE over the device parameter space and modeling the response using quadratic RSM models. The Device Designer environment supports the exploration of the device architecture space by incorporating the ability to perform inverse modeling on a set of device characteristic curves resulting in an equivalent representative device structure.

An exemplary method for optimizing the characteristics of Integrated Circuit's devices, such as MOSFETs, BJTs, Capacitors, resistors and the like for application specific purposes, such as but not limited to high-speed, low-power, high-gain, high-precision, low-noise etc, may comprise the following steps.

1. Select a compact device model, for example Bsim3v3 (available from the Worldwide Web at the following uniform resource locator: http://www-device.EECS.Berkeley.EDU/~bsim3) for MOSFETs devices, which is available from the the University of California at Berkeley, Calif. There are many other commercial and public domain versions of SPICE that are equally acceptable for this purpose.

2. Fully characterize the value of the compact model variables that best fit the initial or nominal device characteristics 110, as obtained for example, from direct measurements or simulations.

3. Run a Design Of Experiments (DOE) on the device parameters at step 125 to extract their effect on the device output characteristics. This step can be performed in two different ways.

In a variant of the exemplary embodiment, the DOE includes inverse modeling, structured as follows.

a. Apply inverse modeling, for example by using a method such as that illustrated in Zachary K. Lee, et al., "Two-dimensional Doping Profile Characterization of MOSFET's by Inverse Modeling Using I-V Characteristics in the Subthreshold Region", IEEE Trans. Electron Devices, vol. 46, pp. 1640–1649, August 1999, which is incorporated by reference herein in its entirety, to get the two-dimensional profile of the initial/nominal structure.

b. Perturb the physical device parameters, for example channel implants energy and dose, oxide thickness and the like, of the inverse modeled structure according to a pre-defined Design Of Experiments (DOE), such as Central Composite Design c. Run device simulations. Extract DC and AC device characteristics 155 corresponding to each point in the chosen DOE.

An alternative DOE method involves measurement of split lots in silicon. This entails running a set of split lots corresponding to a pre-defined DOE, wherein a set of measurable device characteristics, such as channel implants dose and energy, are perturbed, and measuring a set of DC and AC device characteristics corresponding to each point of the DOE A first order expansion of the compact model equations is performed for the DC and AC measurements performed in step iii as a function of the model variables.

4. A set of Figure Of Merit circuits is defined.

5. The performance parameters of the FOM circuits are evaluated for all the points of the DOE defined above and a Response Surface Methodology (RSM) model is constructed.

6. The RSM macro-models are optimized according to a set of performance objectives and specifications. The AC/DC device characteristics 155 corresponding to the optimum are extracted and:

7. The optimal setting of the device architecture parameters is obtained according to one of the two following options.

By directly applying the results of the optimization step (step 146).

By applying inverse modeling as in step 160, to the optimized AC/DC device characteristics 155, the resulting optimal 2-D device profile 165 is obtained.

EXAMPLE

This co-design methodology has been applied to improve the analog characteristics of transistors from an advanced 120 nm CMOS logic technology. Analog performances were monitored using operational transconductance amplifiers (OTAs), current mirrors and MOS switches. Digital performances were monitored using multiple fan-out ring oscillators. The objective of the optimization was to improve leakage and output conductance while maintaining speed (i.e. reduce $g_{ds}$, while maintaining $t_{pd}$). Table 1 compares both the device level and circuit level performances of the initial and optimized technologies.

Note the 10–15% reduction in $g_{ds}$, and reduction of $I_{off}$ to bring it within the 1 nA/µm requirement. This was achieved by only a 3% increase in $t_{pd}$. It was found that the optimized device characteristics could be achieved by adjusting the pocket doping profile of both devices. The net effect of those changes was to make the pocket profile more retrograde in both cases. No other changes to the device structures were required.

TABLE 1

| Circuit/Device | Parameter | Initial | Optim. | % |
|---|---|---|---|---|
| NMOS | Vtsat (mV) | 268 | 286 | +7% |
|  | Vtlin (mV) | 400 | 397 | −1% |
|  | Idsat (µA/µm) | 692 | 673 | −3% |
|  | Ioff (nA/µm) | 1.43 | 0.877 | −40% |
|  | gdsmin (µΩ-1) | 88.6 | 7.86 | −11% |
| PMOS | Vtsat (mV) | 215 | 250 | +16% |
|  | Vtlin (mV) | 404 | 440 | +9% |
|  | Idsat (µA/µm) | 340 | 327 | −3% |
|  | Ioff (nA/µm) | 1.46 | 0.49 | −66% |
|  | gdsmin (µΩ-1) | 96.3 | 82.6 | −15% |
| Ring Osc. | tpd (psec) | 16.7 | 17.3 | +3% |
| OTA (p-load) | Av (dB) | 35.7 | 33.4 | −7% |
|  | f3db (KHz) | 363 | 474 | +30% |
|  | Pwr (µW) | 1.19 | 1.13 | −5% |
| OTA (n-load) | Av (dB) | 33.7 | 33.13 | −2% |
|  | f3db (KHz) | 254.5 | 269.5 | +6% |
|  | Pwr (µW) | 1.22 | 1.22 | 0% |

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A method for selecting a process for forming a device, comprising:

(a) generating a plurality of equations using a response surface methodology model, each equation relating a respective device simulator input parameter to a respective combination of processing parameters that can be used to form the device, the plurality of equations including an equation for each respective simulator input parameter;

(b) forming a model of electrical performance of a figure-of-merit circuit that is representative of an integrated circuit into which the device is to be incorporated; and (c) identifying one of the combinations of processing parameters that results in a device having electrical performance satisfying a set of performance specifications for the figure-of-merit circuit, using the plurality of equations and the device simulator.

2. The method of claim 1, wherein the device simulator is a processor executing a SPICE program.

3. The method of claim 2, wherein step (a) includes identifying variations in a plurality of characteristics of the device based on simulation or experimental measurement of respective combinations of processing parameters in a design of experiment (DOE).

4. The method of claim 3, wherein step (a) further includes extracting a respective set of device model parameters for each of the combinations of the processing parameters in the DOE.

5. The method of claim 4, wherein step (a) further includes fitting a respective polynomial model to each respective set of device model parameters, to form respective ones of the plurality of equations.

6. A method for optimizing a design of a device, comprising the steps of:
- (a) identifying variations in a plurality of characteristics of the device based on simulation or experimental measurement of respective combinations of processing parameters in a design of experiment (DOE);
- (b) extracting a respective set of device model parameters for each of the combinations of the processing parameters in the DOE;
- (c) fitting a respective polynomial model to each respective set of device model parameters, to form respective equations, each equation outputting a SPICE input parameter;
- (d) selecting a figure-of-merit circuit having electrical characteristics representative of an integrated circuit into which the device is to be incorporated; and
- (e) identifying one of the combinations of processing parameters that satisfies a set of performance specifications for the figure-of-merit circuit, using the polynomial models and SPICE.

7. The method of claim 6, further comprising the steps of:
- (f) simulating or measuring a further plurality of characteristics of the device based on the identified combination of processing parameters of step (e); and
- (g) performing inverse modeling to identify a final device structure.

8. The method of claim 7, further comprising:
- (h) developing an initial device structure based on the characteristics of the device identified in step (a); and
- (i) comparing the final device structure to the initial device structure.

9. The method of claim 6, wherein step (e) includes running a respective SPICE simulation for each of the combinations of processing parameters.

10. A method for designing a device, comprising:
- (a) generating a plurality of equations using a response surface methodology model, each equation relating a respective device simulator input parameter to a respective combination of device characteristics, the plurality of equations including an equation for each respective simulator input parameter;
- (b) forming a model of electrical performance of a figure-of-merit circuit that is representative of an integrated circuit into which the device is to be incorporated; and
- (c) identifying one of the combinations of device characteristics that causes the device to satisfy a set of electrical performance specifications for the figure-of-merit circuit, using the plurality of equations and the device simulator.

11. The method of claim 10, wherein the device simulator is a processor executing a SPICE program.

12. The method of claim 11, wherein step (a) includes identifying variations in a plurality of characteristics of the device based on simulation or experimental measurement of respective combinations of processing parameters in a design of experiment (DOE).

13. The method of claim 12, wherein step (a) further includes extracting a respective set of device model parameters for each of the combinations of the processing parameters in the DOE.

14. The method of claim 13, wherein step (a) further includes fitting a respective polynomial model to each respective set of device model parameters, to form respective ones of the plurality of equations.

15. A system for selecting a process for forming a device, comprising:
- means for generating a plurality of equations using a response surface methodology model, each equation relating a respective device simulator input parameter to a respective combination of processing parameters that can be used to form the device, the plurality of equations including an equation for each respective simulator input parameter;
- means for forming a model of electrical performance of a figure-of-merit circuit that is representative of an integrated circuit into which the device is to be incorporated; and
- means for identifying one of the combinations of processing parameters that results in causing the device to satisfy a set of electrical performance specifications for the figure-of-merit circuit, using the plurality of equations and the device simulator.

16. A system for designing a device, comprising:
- means for generating a plurality of equations using a response surface methodology model, each equation relating a respective device simulator input parameter to a respective combination of device characteristics, the plurality of equations including an equation for each respective simulator input parameter;
- means for forming a model of electrical performance of a figure-of-merit circuit that is representative of an integrated circuit into which the device is to be incorporated; and
- means for identifying one of the combinations of device characteristics that satisfies a set of electrical performance specifications for the figure-of-merit circuit, using the plurality of equations and the device simulator.

* * * * *